United States Patent
Kito

(10) Patent No.: US 7,961,266 B2
(45) Date of Patent: Jun. 14, 2011

(54) ARRAY SUBSTRATE, A CORRECTING METHOD THEREOF, AND A LIQUID CRYSTAL DISPLAY DEVICE

(75) Inventor: Kenichi Kito, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 254 days.

(21) Appl. No.: 12/307,130

(22) PCT Filed: Feb. 26, 2007

(86) PCT No.: PCT/JP2007/053468
§ 371 (c)(1),
(2), (4) Date: Dec. 31, 2008

(87) PCT Pub. No.: WO2008/004354
PCT Pub. Date: Jan. 10, 2008

(65) Prior Publication Data
US 2009/0190053 A1    Jul. 30, 2009

(30) Foreign Application Priority Data

Jul. 7, 2006  (JP) ................................. 2006-187778

(51) Int. Cl.
*G02F 1/1343*   (2006.01)
*G02F 1/1333*   (2006.01)
*G02F 1/13*     (2006.01)
*G02F 1/136*    (2006.01)

(52) U.S. Cl. .............................. 349/54; 349/39; 349/139

(58) Field of Classification Search .............. 349/50–60, 349/110, 38, 39, 141, 139, 192
See application file for complete search history.

(56) References Cited

U.S. PATENT DOCUMENTS

| | | | | |
|---|---|---|---|---|
| 5,132,819 A * | 7/1992 | Noriyama et al. | ............. | 349/55 |
| 5,943,106 A | 8/1999 | Sukenori et al. | | |
| 6,777,709 B2 * | 8/2004 | Wu et al. | ......................... | 257/59 |
| 6,822,701 B1 | 11/2004 | Kasahara et al. | | |
| 7,265,387 B2 * | 9/2007 | Murakami | ...................... | 257/59 |
| 7,319,239 B2 * | 1/2008 | Tsubata et al. | .................. | 257/72 |
| 7,430,024 B2 * | 9/2008 | Yagi et al. | ........................ | 349/54 |
| 2002/0018155 A1 * | 2/2002 | Nagata et al. | .................. | 349/42 |
| 2004/0169777 A1 * | 9/2004 | Tanaka et al. | ................... | 349/39 |

(Continued)

FOREIGN PATENT DOCUMENTS

CN    1537256    10/2004

(Continued)

OTHER PUBLICATIONS

International Search Report for PCT/JP2007/053468 mailed Apr. 17, 2007.

*Primary Examiner* — Akm E Ullah
(74) *Attorney, Agent, or Firm* — Nixon & Vanderhye P.C.

(57) ABSTRACT

An array substrate in which a short circuit between a line branch of an auxiliary capacitance line and a pixel electrode can be easily corrected comprises the pixel electrode connected to a switching element arranged near the intersection between a scanning line and a signal line and the auxiliary capacitance line arranged in a layer below the pixel electrode, wherein the auxiliary capacitance line comprises a line trunk arranged substantially parallel to the scanning line and a line branch extending from the line trunk, and the pixel electrode is provided with an aperture which crosses the line branch of the auxiliary capacitance line.

7 Claims, 6 Drawing Sheets

U.S. PATENT DOCUMENTS

| | | |
|---|---|---|
| 2007/0002242 A1 | 1/2007 | Ogata |
| 2008/0049155 A1* | 2/2008 | Yagi et al. ......... 349/39 |
| 2008/0313893 A1* | 12/2008 | Nakasu ............. 29/830 |
| 2010/0033643 A1* | 2/2010 | Horiuchi et al. ..... 349/38 |

FOREIGN PATENT DOCUMENTS

| | | |
|---|---|---|
| JP | 2-108028 | 4/1990 |
| JP | 3-242625 | 10/1991 |
| JP | 5-2184 | 1/1993 |
| JP | 8-33555 | 3/1996 |
| JP | 2004-53752 | 2/2004 |
| JP | 2007-10824 | 1/2007 |

* cited by examiner

ARRAY SUBSTRATE, A CORRECTING METHOD THEREOF, AND A LIQUID CRYSTAL DISPLAY DEVICE

This application is the U.S. national phase of International Application No. PCT/JP2007/053468 filed 26 Feb. 2007 which designated the U.S. and claims priority to Japanese Patent Application No. 2006-187778 filed 7 Jul. 2006, the entire contents of each of which are hereby incorporated by reference.

BACKGROUND OF THE INVENTION

1. Field of the Invention

The present invention relates to an array substrate having an auxiliary capacitance line and a correction method of the array substrate.

2. Description of the Related Art

In recent years, liquid crystal display devices are widely used as display units of household electrical appliances such as computers and televisions. A liquid crystal display device generally comprises an array substrate and a color filter substrate, which are facing to each other with a narrow gap therebetween and bonded together at their peripheral portions, and a liquid crystal filled in the gap. On the array substrate, scanning lines and signal lines are arranged perpendicular to each other in a reticular pattern. In each of pixel regions partitioned by the scanning lines and the signal lines, a pixel electrode is arranged. The pixel electrode and the signal line are connected via a switching element which is on/off controlled by the scanning line. In addition, on the array substrate, an auxiliary capacitance line is arranged overlapping the pixel electrode so that the electric charge which is supplied from the scanning line and stored in the pixel electrode is maintained longer.

Although the electric charge stored in the pixel electrode gradually leaks via the liquid crystal layer and the switching element and therefore decreases by the next application of signal voltage through the scanning line, the decrease is suppressed by the auxiliary capacitance line arranged overlapping the pixel electrode. In general, when the overlapping area of the pixel electrode and the auxiliary capacitance line is larger, the ability to maintain the electric charge stored in the pixel electrode is greater. However, a larger overlapping area results in a lower aperture ratio of the pixel electrode.

This type of liquid crystal display device is disclosed in Japanese Patent Application Unexamined Publication No. 2004-53752. As shown in FIG. 6, an auxiliary capacitance line 51 of an array substrate 50 of this type of liquid crystal display device has a line trunk 51a arranged parallel to a scanning line 52 and line branches 51b extending from the line trunk 51a. The line branches 51b are used to increase the ability to maintain the electric charge stored in a pixel electrode 53. The line branches 51b are arranged along signal lines 54 which are shielded from light by black matrixes of a color filter substrate, thereby suppressing decrease in the aperture ratio.

However, providing the auxiliary capacitance line 51 with the line branches 51b results in interposing a foreign matter such as a conductive foreign matter and causing a short circuit between the pixel electrode 53 and the auxiliary capacitance line 51. Accordingly, the possibility of point defect is increased. When a point defect occurs, the short circuit can be corrected by applying a laser beam to the short-circuited line branch 51b in order to cut it at some midpoint. However, if the insulating layer between the pixel electrode 53 and the auxiliary capacitance line 51 is thin, the laser beam is also applied to the pixel electrode 53.

Although there is another correction method in which the short-circuited area is isolated from the other area of the pixel electrode 53 by applying a laser beam to the pixel electrode 53, this method is difficult to perform because it is difficult to completely isolate and insulate the short-circuited area from the other area of the pixel electrode 53 and thus some area tends to remain connected.

Hence, the present invention aims to provide an array substrate, a correction method of the array substrate, and a liquid crystal display device which can easily correct the above defect.

SUMMARY OF THE INVENTION

In order to overcome the problems described above, an array substrate according to a preferred embodiment of the present invention comprises a pixel electrode connected to a switching element arranged near the intersection between a scanning line and a signal line and an auxiliary capacitance line arranged in a layer below the pixel electrode, wherein the auxiliary capacitance line comprises a line trunk arranged substantially parallel to the scanning line and a line branch extending from the line trunk, and the pixel electrode is provided with an aperture which crosses the line branch of the auxiliary capacitance line.

It is preferable that the aperture of the pixel electrode has a slit shape. In addition, it is preferable when the line branch of the auxiliary capacitance line intersects with the aperture having the slit shape at an angle of between 80 degrees and 100 degrees. It is also preferable that a plurality of the apertures of the pixel electrode are arranged along the length direction of the line branch of the auxiliary capacitance line and that the line branch of the auxiliary capacitance line is arranged along the signal line.

A correction method of such an array substrate preferably comprises cutting the line branch of the auxiliary capacitance line using the aperture of the pixel electrode when there is a short circuit between the pixel electrode and the line branch of the auxiliary capacitance line.

A liquid crystal display device preferably comprises the above array substrate, a substrate which is arranged facing to the array substrate and has a common electrode, and a crystal filled between the array substrate and the substrate.

Because the array substrate has the above configuration, in which the auxiliary capacitance line comprises the line trunk arranged substantially parallel to the scanning line and the line branch extending from the line trunk, and the pixel electrode is provided with the aperture which crosses the line branch of the auxiliary capacitance line, even when there is a short circuit between the pixel electrode and the line branch due to an interposed foreign matter such as a conductive foreign matter, the short circuit can be readily corrected by separating the line branch short-circuited with the pixel electrode using the aperture formed on the pixel electrode. In addition, because it is possible to cut the line branch at the position of the aperture, the pixel electrode is prevented from being radiated by a laser beam for cutting even when the insulating layer between the pixel electrode and the auxiliary capacitance line is thin.

If the aperture of the pixel electrode has a slit shape, it is easy to cut the line branch by applying light energy such as a laser beam, and the decrease in the overlapping area of the pixel electrode and the line branch by the area of the apertures can be suppressed. In addition, if the line branch of the auxiliary capacitance line intersects with the aperture having the slit shape at an angle of between 80 degrees and 100 degrees, the aperture and the line branch are efficiently arranged.

If a plurality of the apertures of the pixel electrode are arranged along the length direction of the line branch of the auxiliary capacitance line, it is possible to select the most appropriate aperture for cutting depending on the position of the short circuit between the pixel electrode and the line branch, thereby limiting the effect of the cutting of the line branch. In addition, if the line branch of the auxiliary capacitance line is arranged along the signal line, the decrease in the aperture ratio of the pixel can be suppressed.

DETAILED DESCRIPTION OF PREFERRED EMBODIMENTS

Figure 1:
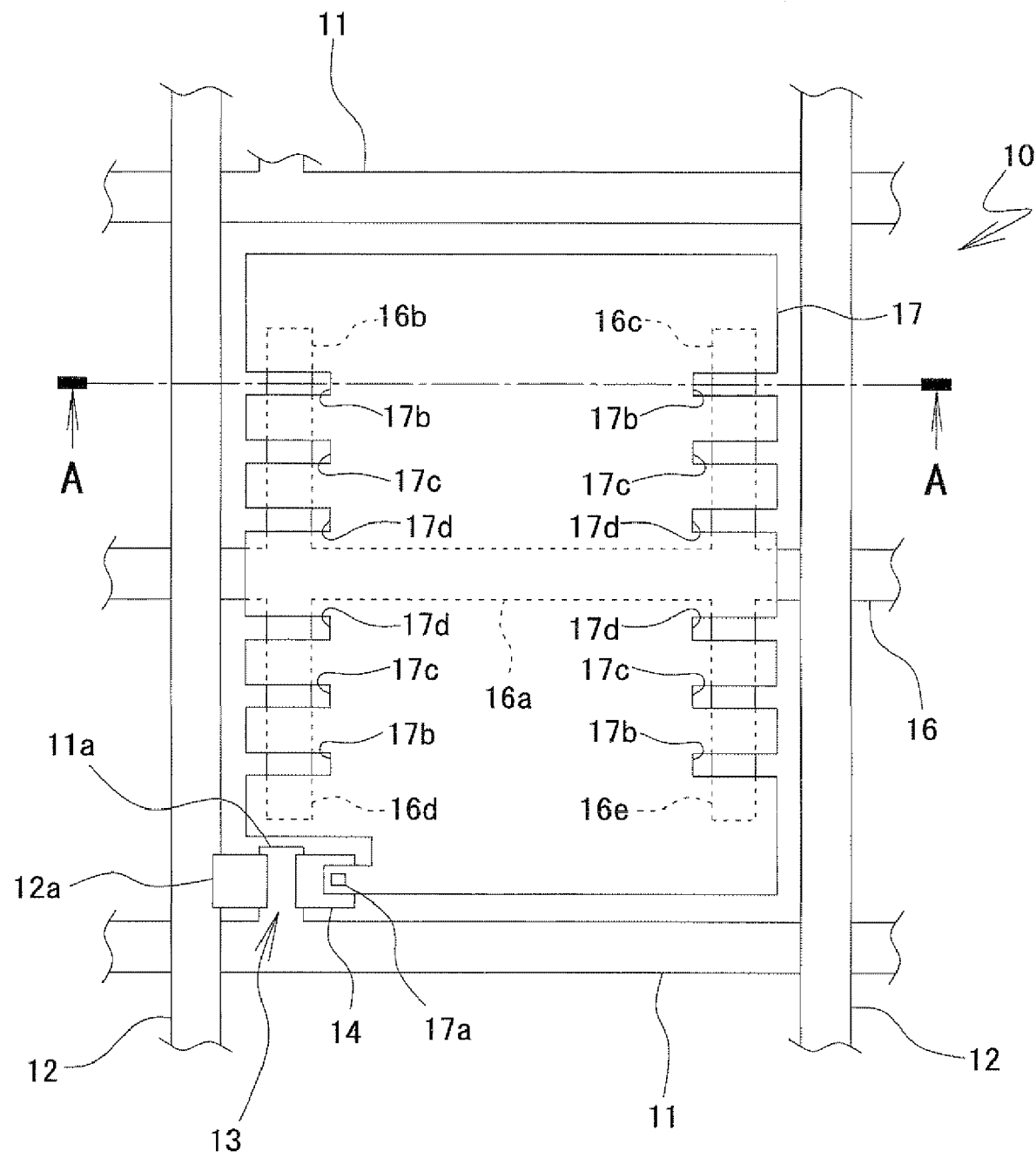
FIG. 1 is a schematic enlarged view of one pixel of a liquid crystal display device according to a preferred embodiment of the present invention.

A detailed description of a preferred embodiment of the present invention will now be given with reference to the accompanying drawings. In the drawings, the same configurations are provided with the same reference signs, and overlapping explanation is omitted. FIG. 1 is a schematic enlarged view of one pixel of a liquid crystal display device according to the preferred embodiment of the present invention, and FIG. 2 is a sectional view of the A-A section in FIG. 1.

Figure 2:
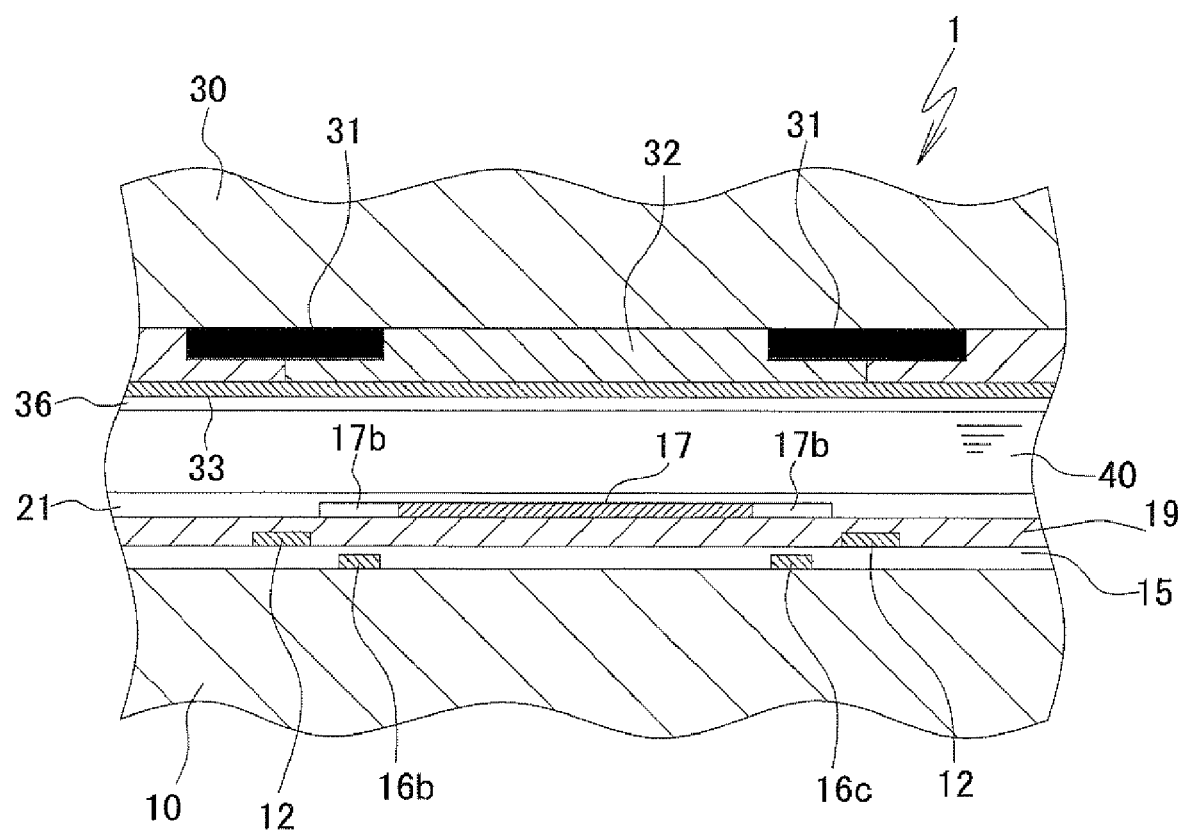
FIG. 2 is a sectional view of the A-A section in FIG. 1.

As shown in FIG. 2, in a liquid crystal display device 1, a liquid crystal layer 40 is provided between a glass substrate (an array substrate) 10 and a glass substrate (a color filter substrate) 30 which are facing to each other. In addition, pixel electrodes 17 are arranged in a reticular pattern on the lower glass substrate 10.

First, a description of the glass substrate (the array substrate) 10 is given. As shown in FIG. 1, scanning lines 11 and signal lines 12 which are perpendicular to each other are arranged around the pixel electrode 17 in a reticular pattern. The scanning line 11 and the signal line 12 intersect with each other such that the signal line 12 is placed over the scanning line 11. Additionally, the scanning line 11 and the signal line 12 are electronically insulated from each other at the intersection.

At the intersection of the scanning line 11 which is arranged below the pixel electrode 17 in FIG. 1 and the signal line 12 which is arranged on the left side of the pixel electrode 17 in FIG. 1, a TFT (a thin film transistor) 13 is formed as a switching element connected to a gate electrode 11a which is a part of the scanning line 11. In addition, an auxiliary capacitance line 16 made of aluminum or other material is arranged under the substantially center of the pixel electrode 17. The auxiliary capacitance line 16 comprises a line trunk 16a arranged parallel to the scanning line 11 and line branches 16b to 16e extending vertically from the line trunk 16a along the right and left ends of the pixel electrode 17. The line branches 16b to 16e are arranged to increase the ability to maintain the electric charge stored in the pixel electrode 17. Because the line branches 16b to 16e are shielded from light by black matrixes 31 of the color filter substrate 30 (to be described later), the decrease in the aperture ratio is suppressed (see FIG. 2).

The scanning line 11 and the auxiliary capacitance line 16 are arranged in the same line layer (a first line layer). That is, the scanning line 11 and the auxiliary capacitance line 16 are formed by applying patterning to the same conductive film. In addition, the scanning line 11 and the auxiliary capacitance line 16 are covered by a gate insulator 15 made of silicon nitride or other material (see FIG. 2).

At a position on the gate insulator 15 corresponding to the TFT 13, a semiconductor layer (not shown) made of amorphous silicon or other material is arranged overlapping a gate electrode 11a. A source electrode 12a and a drain electrode 14, which are parts of the signal line 12, are separately placed on the both sides of the semiconductor layer arranged on the gate electrode 11a. The signal line 12, the source electrode 12a, and the drain electrode 14 are formed in the same line layer (a second line layer) on the gate insulator 15.

The signal line 12 and the TFT 13 are covered by an interlayer insulator 19 which is formed on the gate insulator 15. The interlayer insulator 19 is made of a photosensitive acrylic resin (a photosensitive organic film) material and is arranged between constituents such as the TFT 13 and the first and second line layers (e.g., the scanning line 11 and the single line 12) and the pixel electrode 17 in order to insulate the electric conductors from each other (see FIG. 2).

In each of pixel regions on the interlayer insulator 19, the pixel electrode 17 is provided. The pixel electrode 17 is made of a transparent electric conductor such as an ITO (indium-tin oxide) material.

The TFT 13 is on/off controlled by scanning signal voltage supplied from the gate electrode 11a of the scanning line 11. Display signal voltage supplied from the source electrode 12a of the signal line 12 is supplied to the pixel electrode 17 via a contact hole portion 17a of the pixel electrode 17.

In the pixel electrode 17, apertures 17b to 17d are formed along the line branches 16b to 16e of the auxiliary capacitance line 16. The apertures 17b to 17d, which have a slit shape and cross the line branches 16b to 16e, are used when the branches 16b to 16e placed under the apertures 17b to 17d are cut by applying light energy such as a laser beam. In addition, a lower alignment layer 21 is formed on the pixel electrode 17. The lower alignment layer 21 is made of, for example, polyimide resin.

A description of a method to manufacture the above array substrate 10 is given. First, a single-layer or multi-layer conductor film made of materials such as tungsten, titanium, aluminum, and chromium is formed on the glass substrate 10. This conductor film can be formed using a known method such as sputtering. The formed conductor film is then formed into a predetermined pattern using a method such as photolithography. As a result, the scanning line 11 and the auxiliary capacitance line 16 are formed in the predetermined pattern.

Then, the gate insulator 15 is formed. The gate insulator 15 is made of, for example, silicon nitride and is formed by a method such as a plasma CVD method. The semiconductor layer of the TFT 13 is made of, for example, n+ type amorphous silicon and is formed by a method such as a plasma CVD method. On the gate insulator 15, the signal line 12, the source electrode 13a, and the drain electrode 14 are formed in the same manner as the scanning line.

Then, the interlayer insulating film 19 made of a photosensitive acrylic resin (a photosensitive organic film) material is formed, and a contact hole is formed on the formed interlayer insulating film 19 by a method such as photolithography. On the interlayer insulating film 19, a transparent conductive film made of an ITO material is formed using a method such as sputtering. The formed ITO film is then formed into a predetermined pattern using a method such as photolithography in order to obtain the pixel electrode 17 and the contact hole portion 17a in the predetermined pattern.

After the pixel electrode 17 is formed, the lower alignment layer 21 is formed. A liquid alignment material consisting of polyamide or other material is applied using a cylinder printing press and an inkjet printing press and is then baked by heating the substrate using a device such as a baking system. Accordingly, the solid-state lower alignment layer 21 is formed on the pixel electrode 17. The array substrate 10 is formed through the processes described above.

Next, the glass substrate (the color filter substrate) 30 is described. As shown in FIG. 2, the black matrixes 31 are arranged under the glass substrate 30. The areas on the glass substrate 10 where the scanning line 11, the signal line 12, and the TFT 13 are arranged are shielded from light by the black matrixes 31. Under the glass substrate 30, a color layer 32 having one color among red (R), green (G), and blue (B) is arranged in each pixel. In the preferred embodiment of the present invention, the red (R), green (G), and blue (B) color layers 32 are repeatedly arranged in order in the horizontal direction, while the color layers 32 having the same color are arranged in the vertical direction.

Under the color layer 32, a common electrode 33 common to each pixel is arranged. The common electrode 33 is also made of a transparent electric conductor such as an ITO material. Under the common electrode 33, an upper alignment layer 36 made of, for example, polyimide resin is formed.

The liquid crystal layer 40 is arranged between the glass substrate (the array substrate) 10 and the glass substrate (the color filter substrate) 30. In addition, polarizing plates (not shown) are arranged under the glass substrate 10 and on the glass substrate 30.

A description of a method to manufacture the above color filter substrate 30 will be given. First, a BM resist (a photosensitive resin composition including a black coloring agent) or other material is applied on the glass substrate 30. The applied BM resist is formed into a predetermined pattern by a method such as photolithography in order to obtain the black matrixes 31 in the predetermined pattern.

Then a color ink made of a red, green, or blue coloring photoresist material (a solution in which a pigment of a certain color is dispersed in photosensitive resin) is applied and formed into a predetermined pattern by a method such as photolithography to obtain the color layer 32 in the predetermined pattern. On the color layer 32, the transparent conductive film made of the ITO material is formed using a method such as sputtering to obtain the common electrode 33.

The upper alignment layer 36 is then formed on the common electrode 33. A liquid alignment material consisting of polyamide or other material is applied using a cylinder printing press or an inkjet printing press and is then baked by heating the substrate using a device such as a baking system. Accordingly, the solid-state upper alignment layer 36 is formed on the common electrode 33. The array substrate 30 is formed through the processes described above.

A description of a method to correct a point defect when there is a short circuit between the pixel electrode 17 and one of the line branches 16b to 16e of the auxiliary capacitance line 16 in the array substrate 10 shown in FIG. 1 due to an interposed foreign matter such as a conductive foreign matter will be given referring to FIG. 3.

Figure 3A:
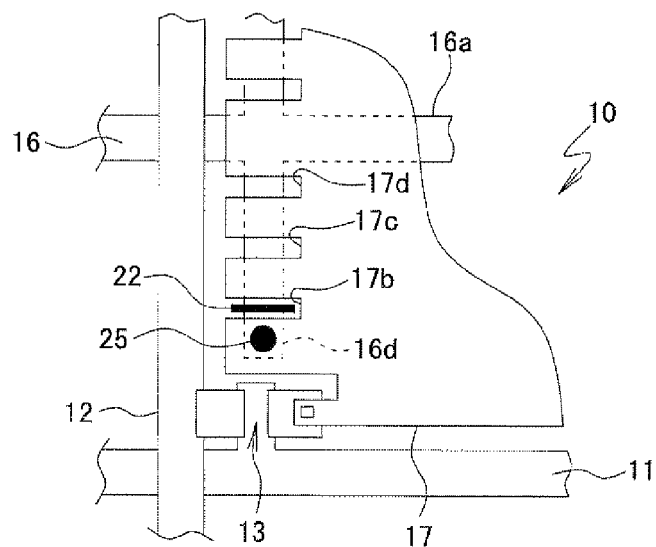
FIG. 3 is a view showing a correction method of an array substrate according to the preferred embodiment of the present invention.

FIG. 3A shows a correction method to be used when the pixel electrode 17 and the line branch 16d are short-circuited due to a foreign matter 25 present at the tip of the line branch 16d of the auxiliary capacitance line 16. In this case, the short-circuited portion is separated to correct the short circuit with the pixel electrode 17 by cutting the line branch 16d at a cutting portion 22 using the aperture 17b being the closest aperture to the short-circuited portion among the three apertures 17b to 17d which are arranged between the short-circuited portion and the line trunk 16a.

Figure 3B:
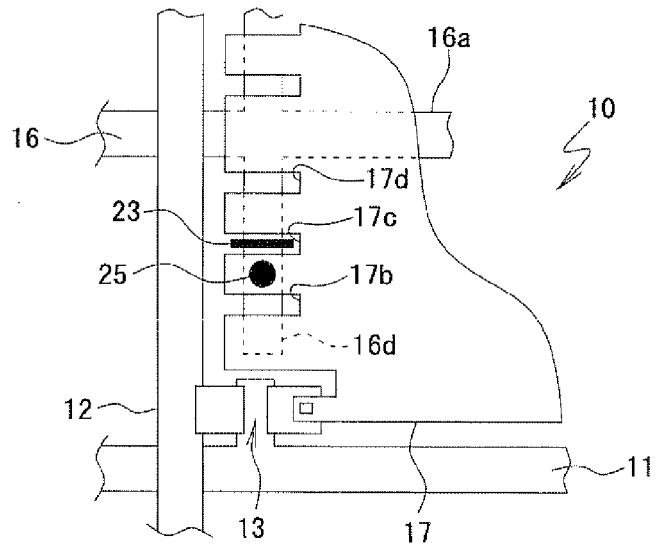

FIG. 3B shows a correction method to be used when the pixel electrode 17 and the line branch 16d are short-circuited due to the foreign matter 25 present at a position closer to the tip than the middle of the line branch 16d of the auxiliary capacitance line 16. In this case, the short-circuited portion is separated to correct the short circuit with the pixel electrode 17 by cutting the line branch 16d at a cutting portion 23 using the aperture 17c being the closer aperture to the short-circuited portion of the two apertures 17c and 17d which are arranged between the short-circuited portion and the line trunk 16a.

Figure 3C:
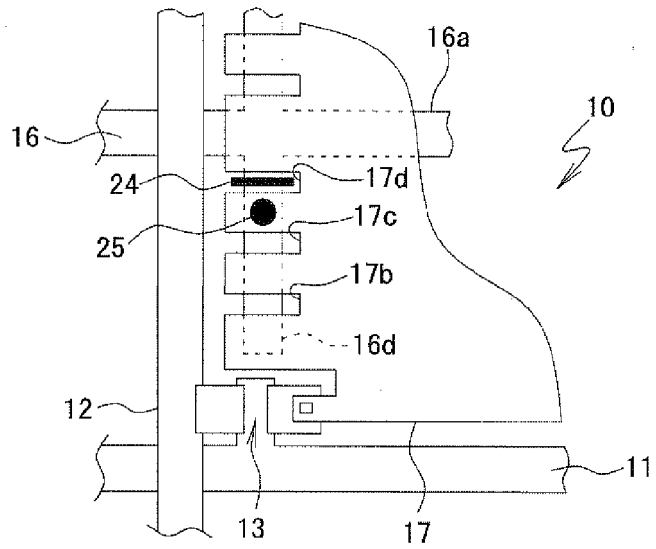

FIG. 3C shows a correction method to be used when the pixel electrode 17 and the line branch 16d are short-circuited due to the foreign matter 25 present at a position closer to the base end than the middle of the line branch 10d of the auxiliary capacitance line 16. In this case, the short-circuited portion is separated to correct the short circuit with the pixel electrode 17 by cutting the line branch 16d at a cutting portion 24 using the aperture 17d arranged between the short-circuited portion and the line trunk 16a.

The foregoing cutting is performed by applying light energy to the cutting portions 22 to 24 of the line branch 16d, which are located in the apertures 17b to 17d, from the side of the pixel electrode 17 of the array substrate 10. Various laser beams can be used as the light energy. When the light energy is applied, the line branch 16d is cut because the conductor which composes the line branch 16d and is situated at the position radiated by the light energy is dissipated by the heat.

Even when the pixel electrode 17 and the line branch 16d are short-circuited due to the interposed conductive foreign matter 25, the short circuit can be readily corrected by separating the line branch 16d being short-circuited with the pixel electrode 17 using the apertures 17b to 17d formed on the pixel electrode 17 as described above. In addition, because it is possible to cut the line branch 16d at the positions of the apertures 17b to 17d by applying a laser beam, the pixel electrode 17 is not radiated by the laser beam for cutting even when the insulating layer (the interlayer insulating film 19 in the preferred embodiment of the present invention) between the pixel electrode 17 and the auxiliary capacitance line 16 is thin.

Because the apertures 17b to 17d of the pixel electrode 17 have a slit shape and cross the line branches 16b to 16d of the auxiliary capacitance line 16, it is easy to cut the line branches 16b to 16e by applying the laser beam. In addition, the decrease in the overlapping area of the pixel electrode and the line branches by the area of the apertures is suppressed when the apertures has the slit shape, as compared with when the apertures have, for example, a circular shape.

In addition, because a plurality of (three, in the preferred embodiment of the present invention) apertures 17b to 17d of the pixel electrode 17 are arranged along the length direction of the line branches 16b to 16e, it is possible to select the most appropriate aperture for cutting depending on the position of the short-circuited portion between the pixel electrode 17 and the line branches 16b to 16e, thereby limiting the effect of the cutting of the line branch.

Figure 4:
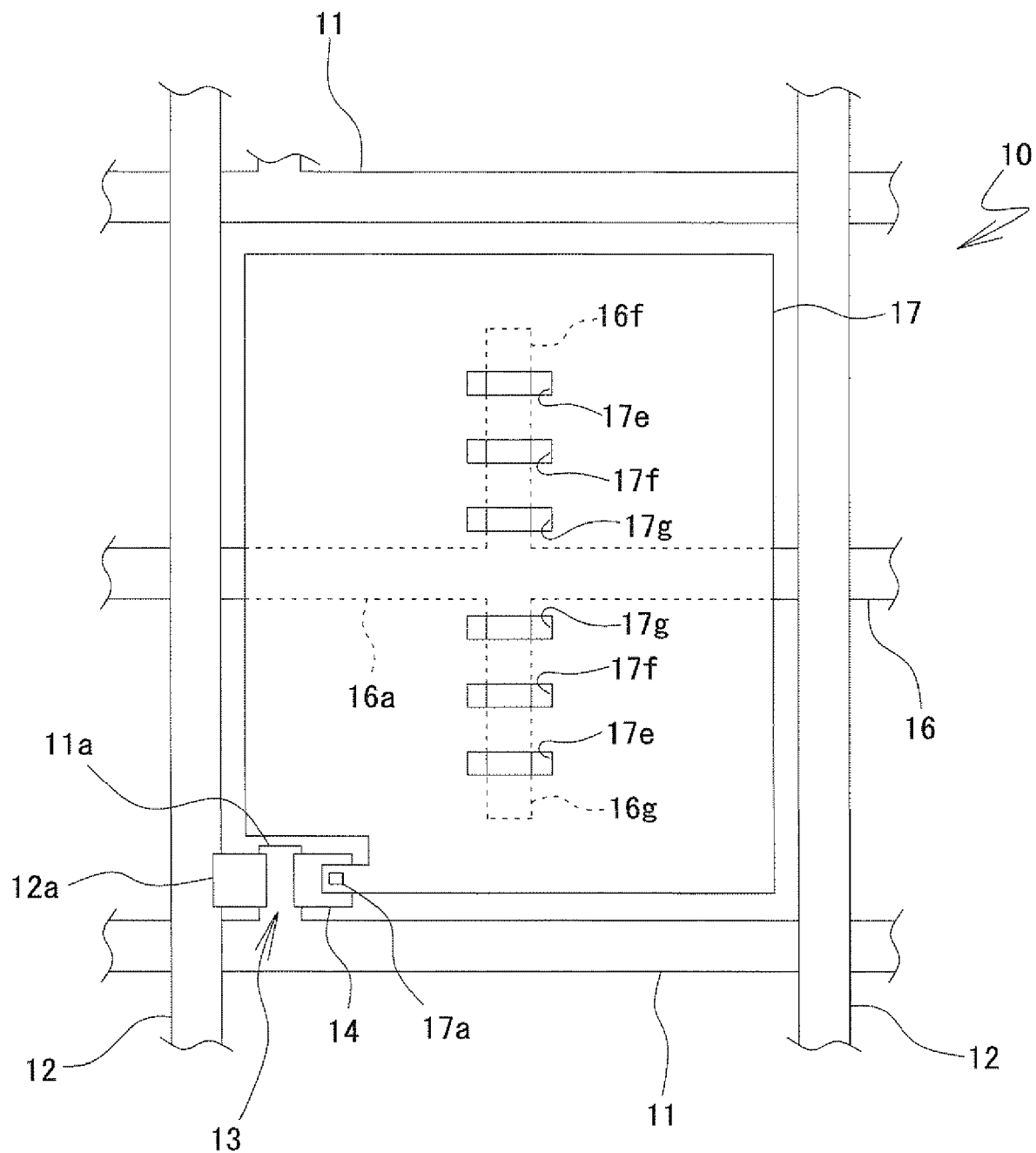
FIG. 4 is a view showing a first modified example of the preferred embodiment of the present invention shown in FIG. 1.

The present invention is not limited to the preferred embodiment of the present invention described above, and variations may be made within the scope of the intension of the present invention. For example, in the preferred embodiment of the present invention, the line branches 16b to 16e are arranged along the signal lines 12; however, line branches 16f and 16g extending vertically from the line trunk 16a may be formed in the center of the pixel electrode 17, and apertures 17e to 17g are formed in the line branches 16f and 16g as shown in FIG. 4.

Figure 5:
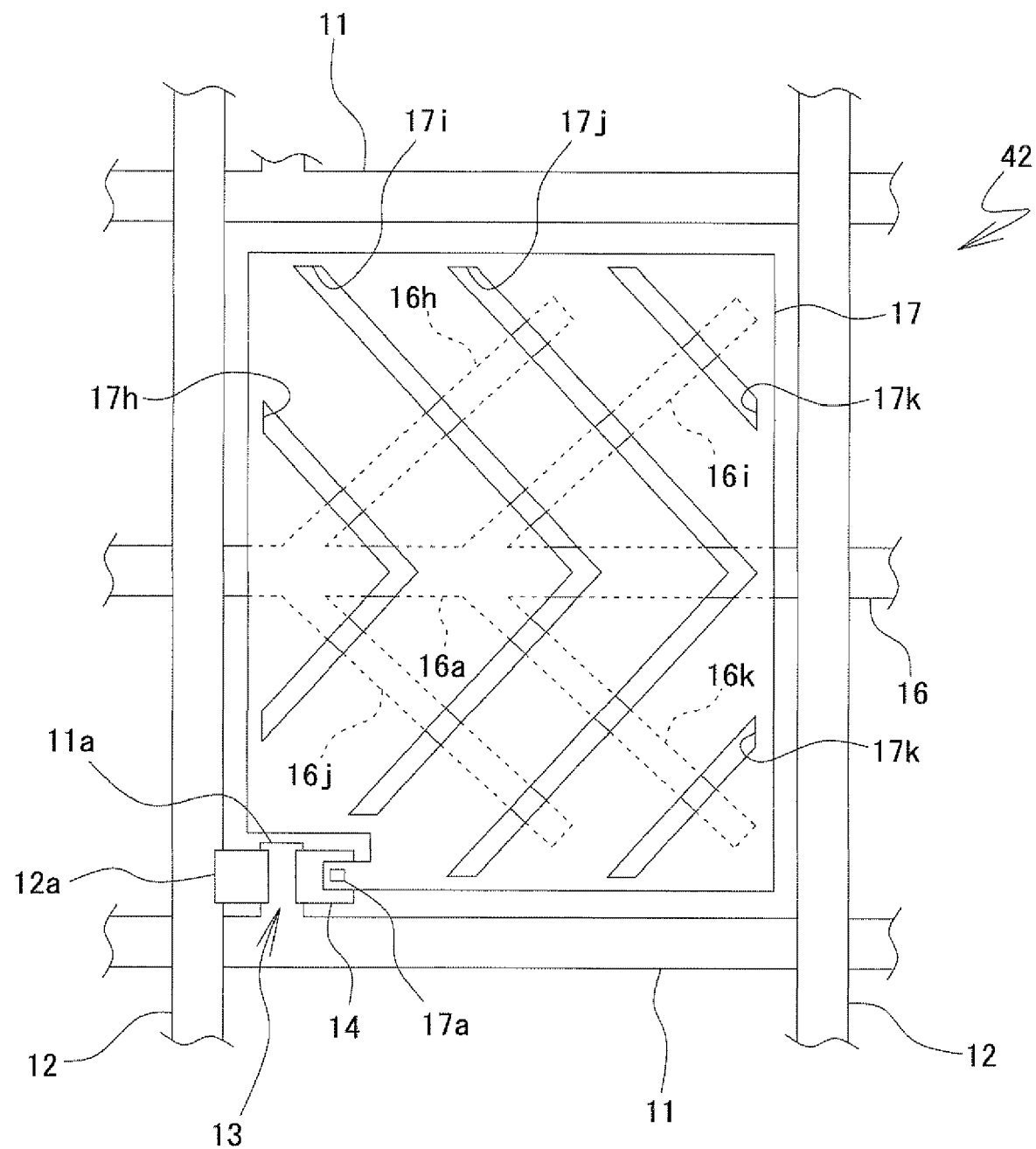
FIG. 5 is a view showing a second modified example of the preferred embodiment of the present invention shown in FIG. 1.
Figure 6:
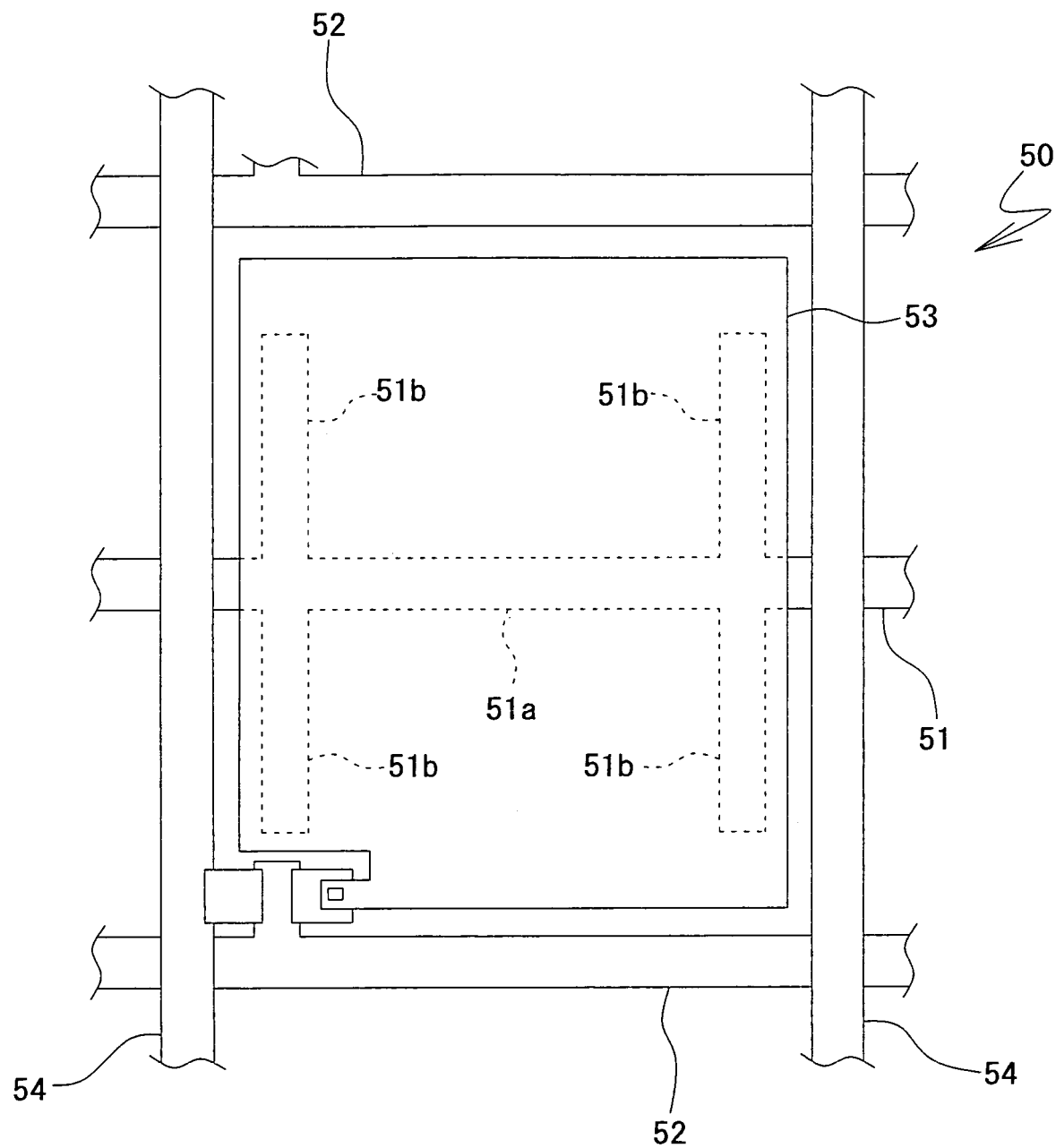
FIG. 6 is a view showing the schematic configuration of a conventional array substrate.

Alternatively, the configuration shown in FIG. 5 may be used. An array substrate 42 shown in FIG. 5 is used for a vertical alignment liquid crystal display device having liquid crystal molecules with negative dielectric anisotropy. In addition to being used to correct a short circuit between the pixel electrode 17 and line branches 16h to 16k due to an interposed conductive foreign matter, apertures 17h to 17k can also be used to improve viewing angle characteristics by generating an oblique electric field (a fringe field) when voltage is applied to the pixel electrode 17 and thereby controlling the alignment of the liquid crystal molecules (not shown). As shown in FIG. 5, the apertures 17h to 17k have an oblique slit shape and are arranged symmetrically with respect to the line trunk 16a such that they cross the line branches 16h to 16k in the layer below. The correction method shown in FIG. 3 is of course applicable to this array substrate 42.

What is claimed is:

1. An array substrate comprising:
   a pixel electrode connected to a switching element that is disposed near an intersection between a scanning line and a signal line in a pixel region partitioned by the scanning line and the signal line that intersect with each other; and
   an auxiliary capacitance line that is disposed in a layer below the pixel electrode while interposing an insulating film between the pixel electrode and the layer, wherein the auxiliary capacitance line comprises a line trunk arranged substantially parallel to the scanning line and a line branch extending from the line trunk, and the pixel electrode is provided with an aperture defined therein which exposes a portion of the line branch of the auxiliary capacitance line via the insulating film.

2. The array substrate according to claim 1, wherein the aperture of the pixel electrode has a slit shape.

3. The array substrate according to claim 2, wherein the line branch of the auxiliary capacitance line intersects with the aperture having the slit shape at an angle of between 80 degrees and 100 degrees.

4. The array substrate according to claim 1, wherein a plurality of the apertures of the pixel electrode are arranged along a length direction of the line branch of the auxiliary capacitance line.

5. The array substrate according to claim 1, wherein the line branch of the auxiliary capacitance line is arranged along the signal line.

6. A correction method of an array substrate the array substrate comprising: a pixel electrode connected to a switching element disposed near an intersection between a scanning line and a signal line in a pixel region partitioned by the scanning line and the signal line that intersect with each other in a reticular pattern; and an auxiliary capacitance line disposed in a layer below the pixel electrode while interposing an insulating film between the pixel electrode and the layer, wherein the auxiliary capacitance line comprises a line trunk arranged substantially parallel to the scanning line and a line branch extending from the line trunk, and the pixel electrode is provided with an aperture through which a portion of the line branch of the auxiliary capacitance line is exposed while the insulating film is interposed between the pixel electrode and the layer of the auxiliary capacitance line, the correction method comprising:
   cutting the line branch of the auxiliary capacitance line using the aperture of the pixel electrode when there is a short circuit between the pixel electrode and the line branch of the auxiliary capacitance line.

7. A liquid crystal display device comprising:
   an array substrate that comprises:
   a pixel electrode connected to a switching element disposed near an intersection between a scanning line and a signal line in a pixel region partitioned by the scanning line and the signal line that intersect with each other in a reticular pattern; and
   an auxiliary capacitance line disposed in a layer below the pixel electrode while interposing an insulating film between the pixel electrode and the layer, wherein the auxiliary capacitance line comprises a line trunk arranged substantially parallel to the scanning line and a line branch extending from the line trunk, and the pixel electrode is provided with an aperture through which a portion of the line branch of the auxiliary capacitance line is exposed while the insulating film is interposed between the pixel electrode and the layer of the auxiliary capacitance line;
   a color filter substrate facing to the array substrate and has a common electrode, and a liquid crystal filled between the array substrate and the color filter substrate.

* * * * *